United States Patent [19]
Volz et al.

[11] Patent Number: 5,584,707
[45] Date of Patent: Dec. 17, 1996

[54] CHIP SOCKET SYSTEM

[75] Inventors: Keith L. Volz, Jamestown; Robert M. Renn, Pfafftown; Robert D. Irlbeck, Greensboro; Frederick R. Deak, Kernersville, all of N.C.

[73] Assignee: The Whitaker Corporation, Wilmington, Del.

[21] Appl. No.: 218,549

[22] Filed: Mar. 28, 1994

[51] Int. Cl.⁶ .................................................... H01R 9/09
[52] U.S. Cl. ......................................................... 439/72
[58] Field of Search ............................... 439/68, 73, 525, 439/70, 72

[56] References Cited

U.S. PATENT DOCUMENTS

| | | | |
|---|---|---|---|
| 4,872,845 | 10/1989 | Korsunsky et al. | 439/70 OR |
| 4,936,783 | 6/1990 | Petersen | 439/70 OR |
| 5,088,930 | 2/1992 | Murphy | 439/70 OR |
| 5,176,524 | 1/1993 | Mizuno et al. | 439/68 OR |
| 5,232,372 | 8/1993 | Bradley et al. | 439/66 |

*Primary Examiner*—Larry I. Schwartz
*Assistant Examiner*—Daniel Wittels

[57] ABSTRACT

This invention is directed to a socket system for the receipt of an integrated circuit "chip", where such a chip, as known in the art, typically is a planar electronic device having plural leads extending from the periphery thereof. The system, operatively mounted to a planar electronic device, such as a motherboard, comprises a frame having a central recess defined by converging side walls and terminating in a floor, and plural slots about the periphery of the floor for receiving elastomeric connectors for electrically interconnecting the chip leads to the mother board. Overriding the frame, for mechanical engagement therewith, is a force applying member, where such member includes plural ribs extending downwardly from the member and positioned to initially contact the respective converging side walls when the force applying member is caused to mechanically engage the frame. In the engaging mode, the ribs are caused to ride along the converging walls and flex inwardly towards the floor slots into which the chip leads lie. By this action the ribs apply a lateral force to and wipe the leads, while applying a vertical force to the ends of the chip leads overlying the elastomeric connector.

11 Claims, 8 Drawing Sheets

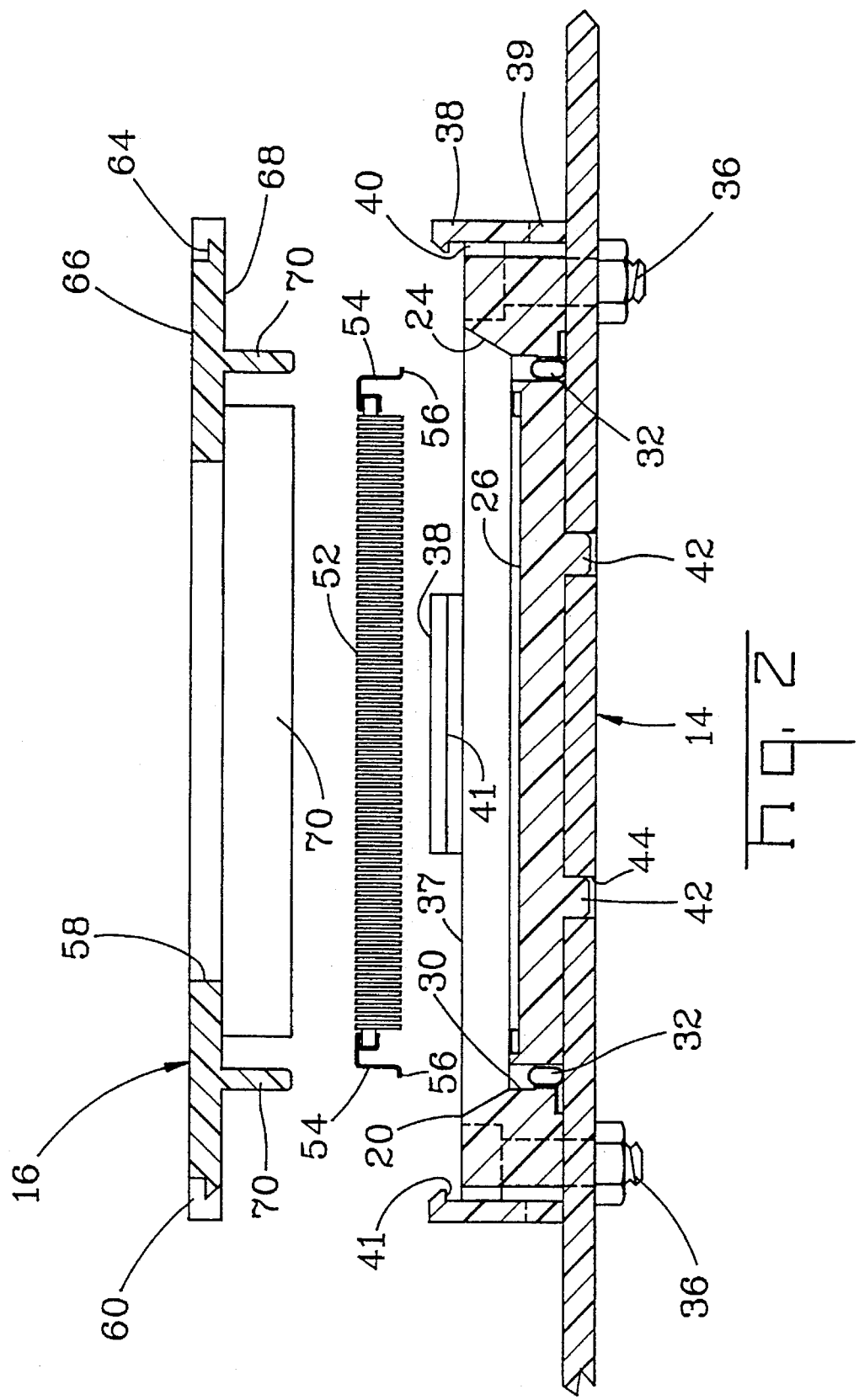

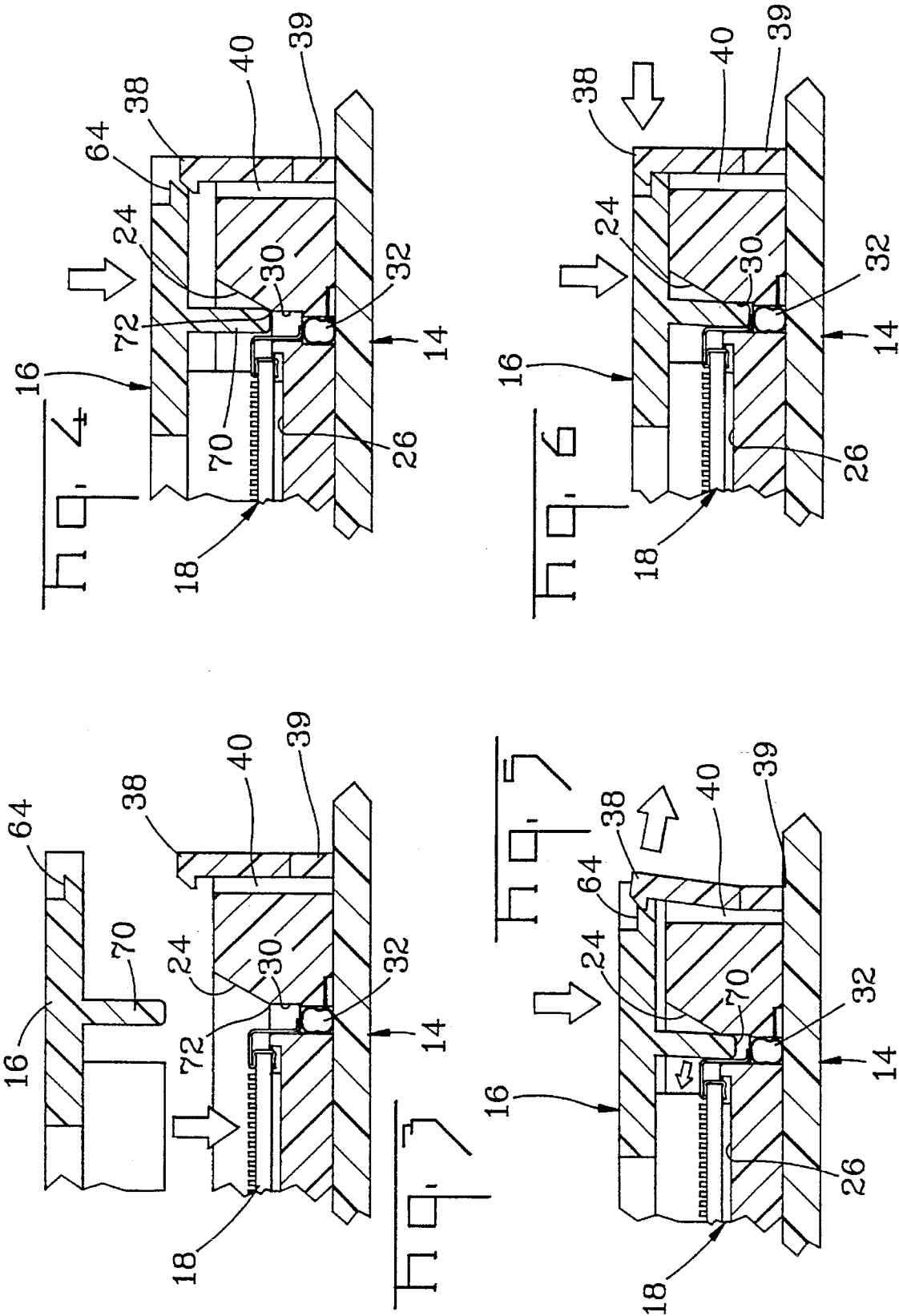

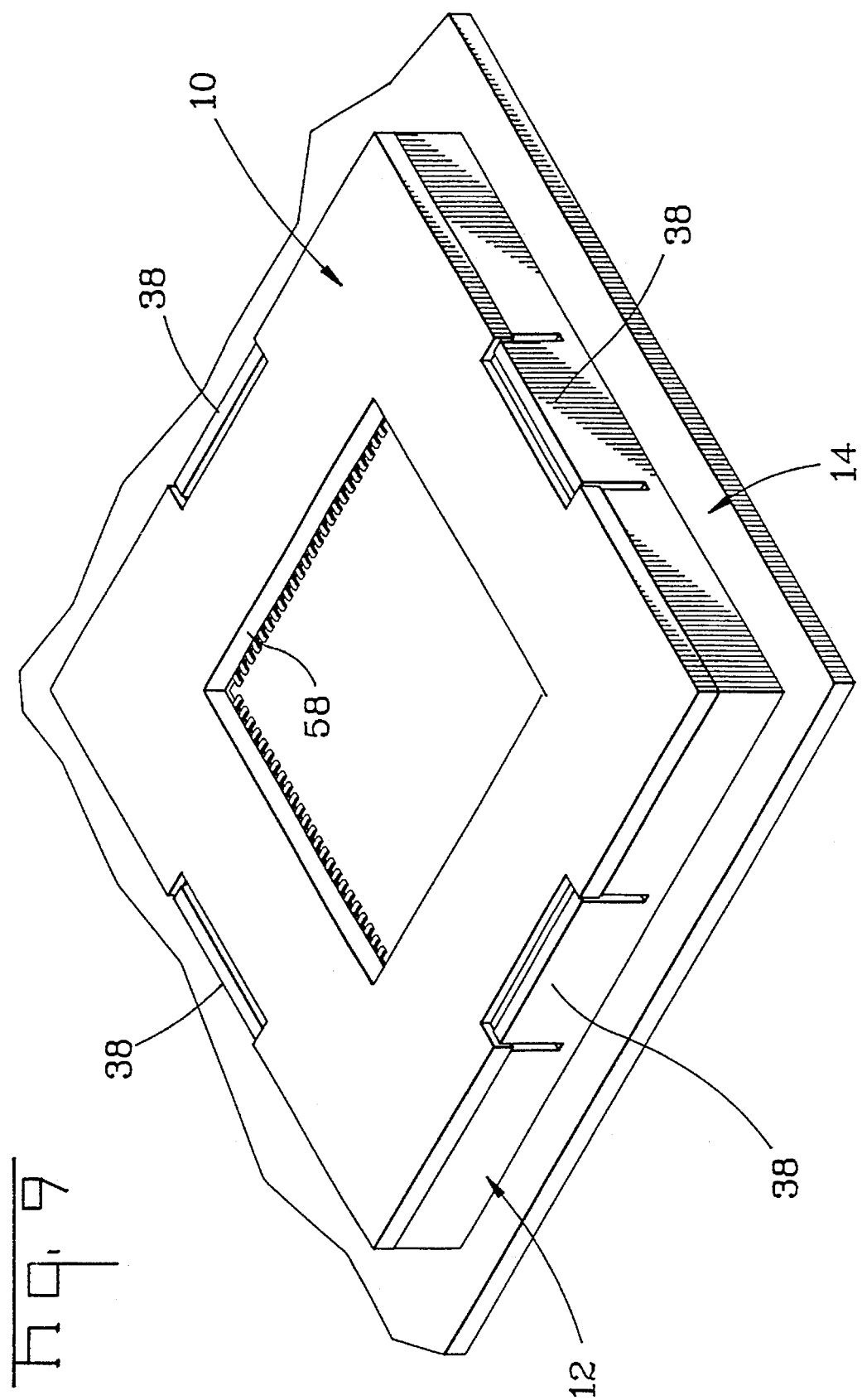

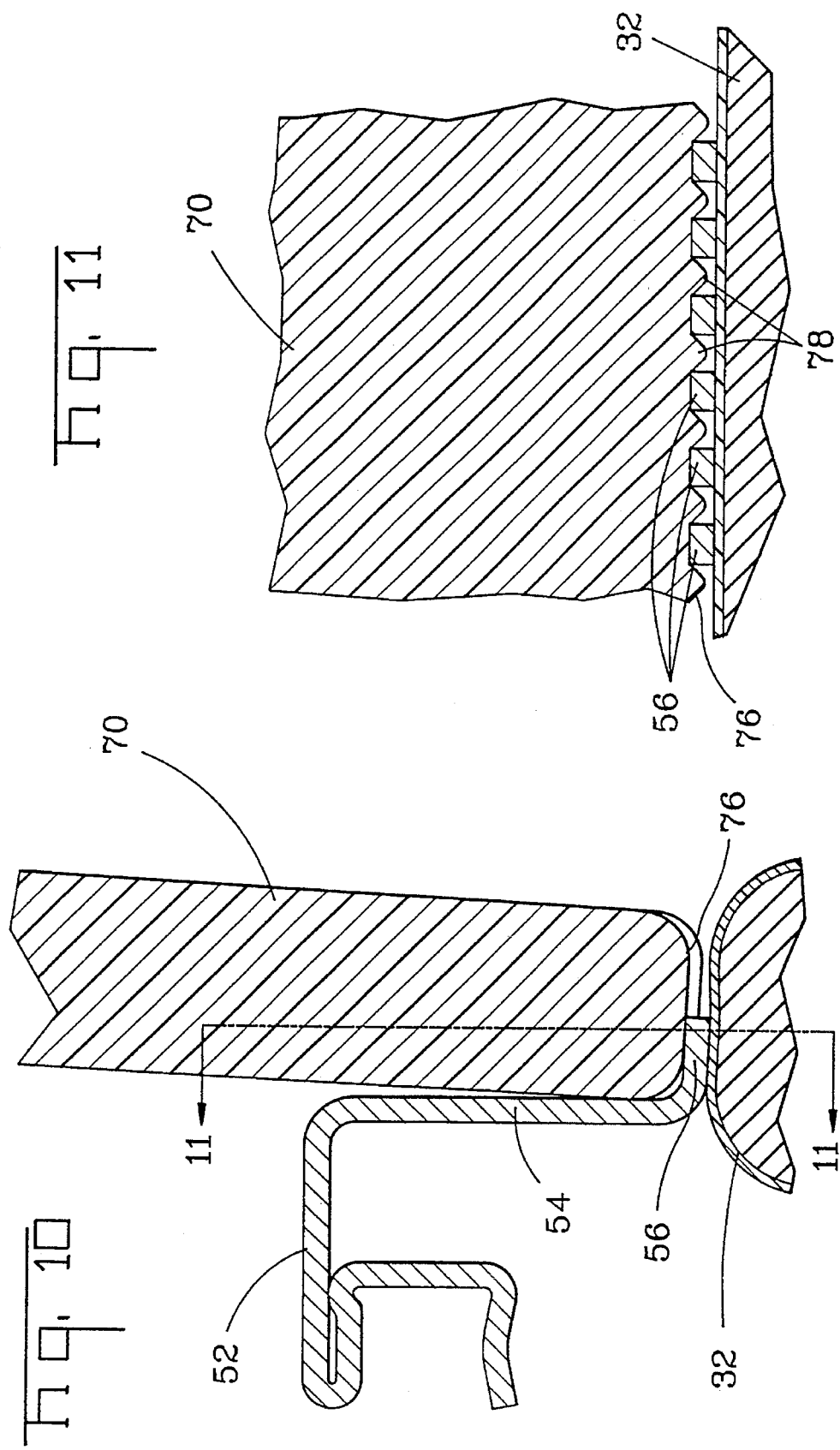

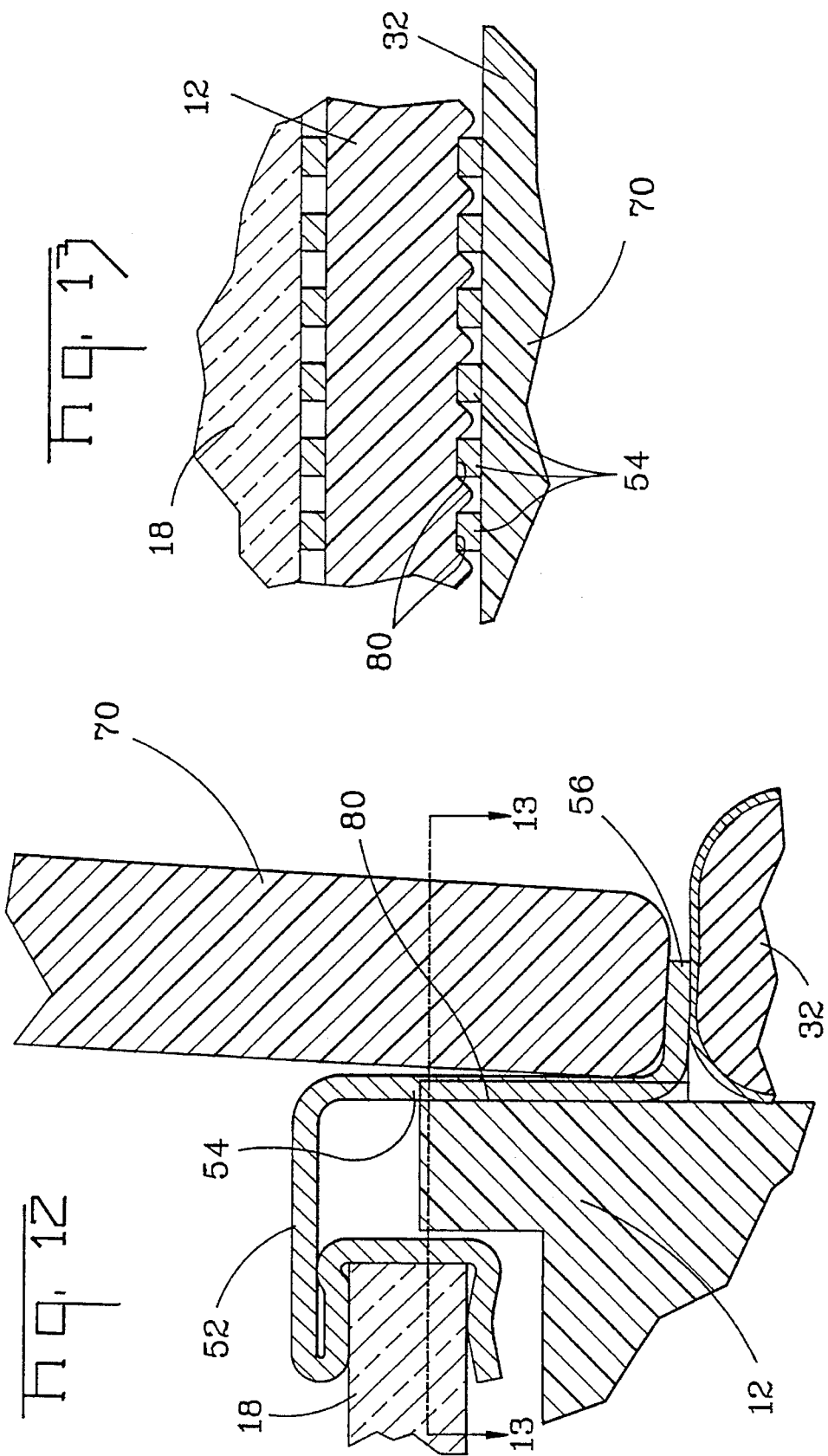

5,584,707

CHIP SOCKET SYSTEM

BACKGROUND OF THE INVENTION

This invention relates to a socket system for the receipt of an integrated circuit "chip", where such chip, as known in the art, typically comprises a planar electronic device, having plural leads extending from the periphery thereof for electrical interconnection to a second planar electronic device, such as a motherboard.

There are many applications for socket systems to electrical interconnect one electronic device to another. One such system is a burn-in test socket, where a manufacturer of chips will subject same to an elevated temperature, while, at the same time, electrically powering the chips. By way of example, a batch of chips is electrically powered in an oven where the temperature is maintained at approximately 150° C. for an extended period of time, such as 1,000 hours. This is referred to in the art as "burn-in". For additional information on burn-in testing, and a socket system for accomplishing same, reference is made to copending application, U.S. Ser. No. 08/081,769 filed Jun. 23, 1993, and assigned to the assignee hereof.

Once the chip has passed this severe test and sold to an end user, an effective socket system is needed for the end use applications. An important feature of such a system is that it provide a uniform and adequate normal force to the chip in electrical contact with an underlying electronic device, such as a motherboard. More precisely, the normal force is uniformly applied against the chip leads projecting from the chip body.

The present invention offers a unique socket system that applies a lateral and vertical force to the chip leads, while effecting a wiping action of the leads in the assembly thereof. The features of this invention will become apparent in the description which follows, particularly when read in conjunction with the accompanying drawings.

SUMMARY OF THE INVENTION

This invention is directed to a socket system for the receipt of an integrated circuit "chip", where such a chip, as known in the art, typically is a planar electronic device having plural leads extending from the periphery thereof. The system is operatively mounted to a planar electronic device, such as a motherboard, and comprises a frame having a central recess defined by converging side walls and terminating in a floor, and plural slots about the periphery of the floor for receiving elastomeric connectors for electrically interconnecting the chip leads to the motherboard. Overriding the frame, for mechanical engagement therewith, is a force applying member, where such member includes plural ribs extending downwardly from the underside of the member and positioned to initially contact the respective converging side walls when the force applying member is caused to mechanically engage the frame. In the engaging mode, the ribs are caused to ride along the converging walls and flex inwardly towards the floor slots into which the chip leads lie. The exposed chip leads are typically "L" shaped. When the force applying member engages the frame, the ribs apply a lateral force to and wipe the leads, while applying a vertical force to the ends of the chip leads overlying the elastomeric connector. Additionally, means may be included in the system to separate and protect the chip leads.

BRIEF DESCRIPTION OF THE DRAWINGS

FIG. 2 is a sectional view of a partially assembled socket system according to the invention.

FIGS. 3 to 6 are partially sectioned views illustrating the sequence of engaging the force applying member to the frame of the socket system to laterally secure and wipe the chip leads within the frame.

FIGS. 8 and 9 are perspective views of the socket system prior to and after final assembly, respectively.

FIG. 10 is a partial, but enlarged sectional view taken through a rib of the force applying member, and the electrical leads to be captured thereby.

FIG. 11 is a sectional view taken along line 11—11 of FIG. 10.

FIG. 12 is a partial, but enlarged sectional view similar to FIG. 10 showing an alternate means of separating and protecting the chip leads.

FIG. 13 is a sectional view taken along line 13—13 of FIG. 12.

DETAILED DESCRIPTION OF PREFERRED EMBODIMENT

Figure 1:
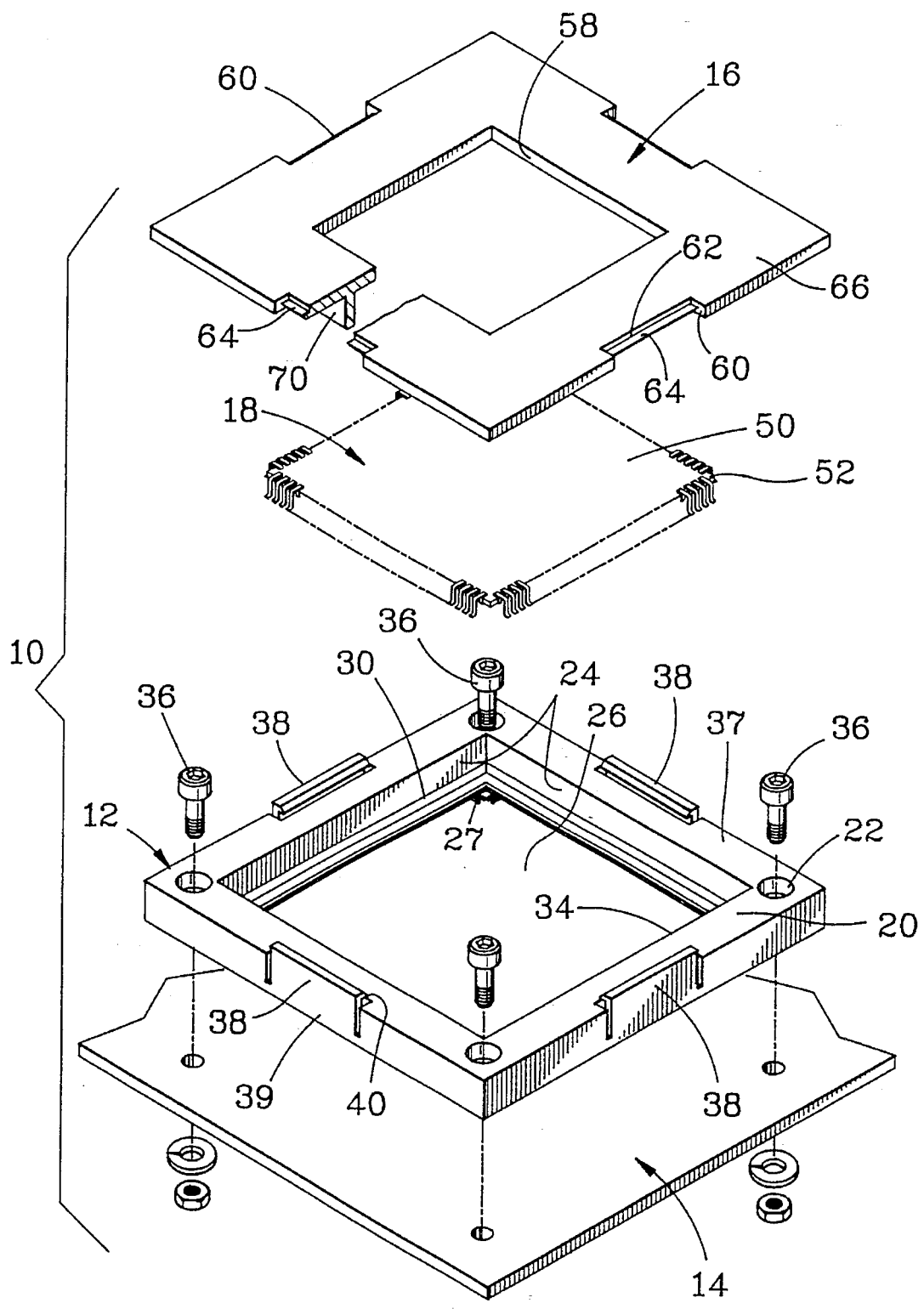
FIG. 1 is an exploded perspective view of the socket system according to the invention, where a portion of the upper component has been removed to illustrate details thereof.

The invention hereof relates to a socket system for the receipt of an integrated circuit "chip". The socket system 10, as shown in FIGS. 1 and 2, comprises an essentially rectangular frame 12 for mounting to a planar electronic device 14, such as a motherboard, and a force applying member 16, which, as explained hereinafter, is intended to apply a normal and lateral force to the leads of a contained chip 18 seated within the frame of the socket system.

The frame 12, molded of a dielectric material, such as plastic, consists of a peripheral wall 20, a central recess 22 having converging side walls 24 leading to a floor 26, where the floor may include alignment ribs 27 for the precise positioning of the chip 18. At the base of the converging side walls 24, plural through slots 30 are provided to receive resilient electrical interconnection means 32, such as an elastomeric connector. An elastomeric connector of the type contemplated for use herein, is a commercial product sold by AMP Incorporated, Harrisburg, Pa., under the registered trademark AMPLIFLEX, a trademark owned by The Whitaker Corporation, Wilmington, Del. These connectors, intended for surface mount interconnection systems, consist of a thin flexible polyimide film, having etched electrical circuitry thereon, wrapped around a soft, non-conducting core, such as silicone, where the core is formulated to resist permanent set under long term compression.

The frame 12, about the peripheral wall 20, is provided with plural through holes 34, each hole receiving a threaded fastener 36 for mounting the frame to the electronic device 14. The holes 34 include a recessed head portion so that the fasteners 36 are fully received therein to yield a continuous planar surface 37 upon which the force applying member 16 is seated. Additionally, along the outer edge of the peripheral walls 20, there are provided a plurality of integrally molded latching arms 38. The arms are molded at the base 39, with a spacing 40 about the upper portion thereof so the arm 38 may flex away from the body of the wall. Projecting inwardly from each arm is a latching shoulder 41, where the function thereof will be more apparent in the discussion which follows on the assembly sequence of FIGS. 3 to 6.

Finally, as best seen in FIG. 2, the underside of the peripheral walls 20 is provided with plural alignment projections 42 which are received in complementary holes 44 in the electronic device 14, to effect alignment of the frame and chip to the circuitry of the electronic device 14.

The integrated circuit chip 18, as known in the art, typically comprises a rectangular body 50 having a preselected circuit pattern thereon, and a plurality of leads 52 extending from the body 50. The leads 52 are L-shaped having a first leg 54 with an end or contact portion 56 formed at a right angle to first leg 54, where said leads, by virtue of their contact with the electrical interconnection means 32, support the chip within the system.

The force applying member 16, molded of a dielectric material, such as plastic, is essentially a planar member adapted to overlie the contained chip 18 and seat on frame surface 37. The force applying member 16 may include a central opening 58. Further, about the periphery of the member, plural recesses 60 are included, where the position or location thereof is aligned with the respective latching arms 39. Each such recess, along the inner wall 62 thereof, includes a shoulder 64 recessed from the upper surface 66 of the member 16. Finally, projecting from the lower surface 68, as seen in FIG. 2, are plural ribs 70, where the length thereof is essentially coextensive with the array of chip leads 52. Further, such ribs 70 are arranged about the member 16 so that in a preassembled position the ribs will overlie a portion of the converging side walls 24. The ribs, though formed of a relatively rigid plastic, will flex when a lateral force is applied thereto. As will be explained later, particularly with reference to FIGS. 10 to 13, the invention contemplates means to separate and protect the leads within the system hereof.

Figure 7:
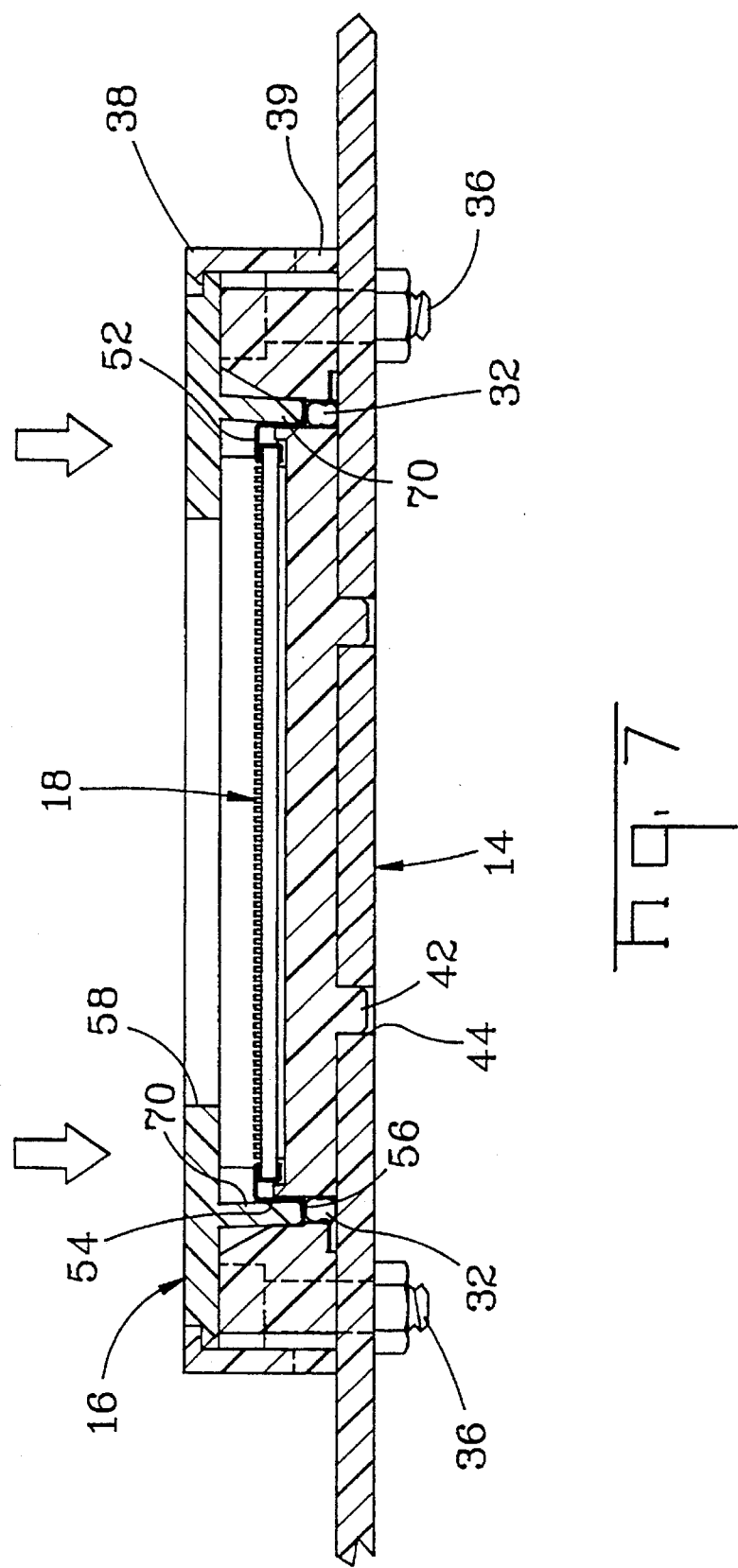
FIG. 7 is a full sectional view of the assembled and latched socket system partially illustrated in FIG. 6.

FIGS. 3 to 6, respectively, represent the steps of assembly of the socket system of this invention. In the figures it will be noted that the chip 18 has been seated on the frame floor 26, and that the chip leads 52 reside within the respective slots 30 with the lead end portions overlying and in contact with interconnection means 32. To assemble the socket system, the force applying member 16 is directed toward the frame 12 (FIG. 3), then in contact therewith (FIG. 4) the ribs 70 rest against the converging walls 24 near the junction 72 of the wall 24 and slot 30. As the force applying member 16 continues toward the frame 12, the converging walls 24 cam the ribs 70 toward and into the slots 30 (FIG. 5), note the small direction arrow. As the rib enters the slot 30, the end of the rib applies a lateral force to the chip lead, specifically the first leg 54, while wiping the lead and effecting alignment of the leads with respect to the underlying elastomeric connector. Concurrent with this action, the respective latching arms 38 act with the shoulders 64 to flex said arms 38 outwardly until the latching arms 36 may override the shoulders 64 and resile into locking engagement therewith (FIG. 6). FIG. 7 illustrates a full sectional view of the assembled socket system of this invention; note that the ribs 70 remain flexed inwardly against the lead leg 54 applying a sustained lateral force thereagainst, while further applying a normal force against the lead contact portion 56 in contact with the resilient interconnection means 32, electrically connecting the contact portion 56 to corresponding traces or pads on the electronic device 14.

Figure 8:
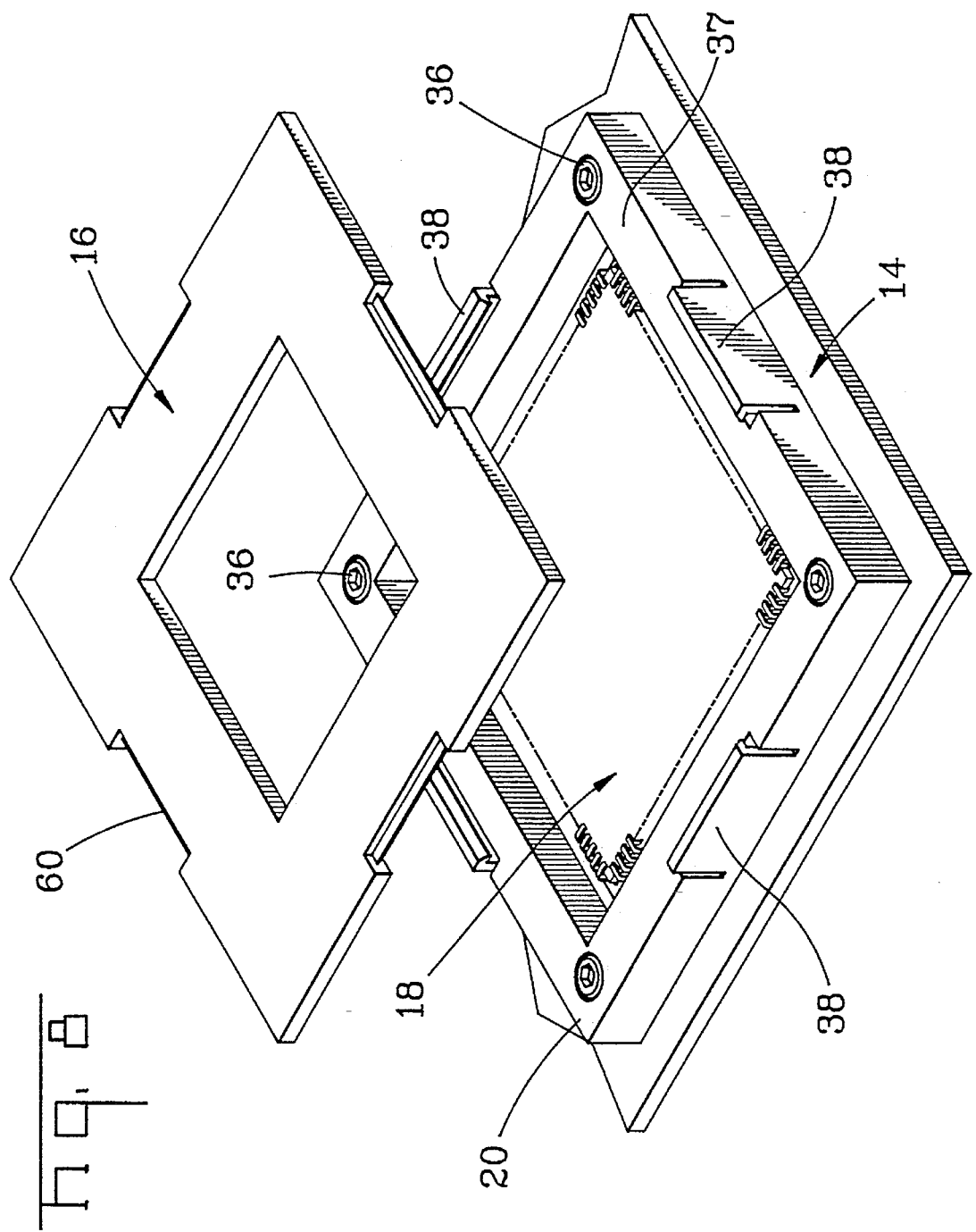

FIGS. 8 and 9 are, respectively, perspective views of a preassembled and finally assembled socket system of this invention. Note that in FIG. 8 the assembly fasteners 36 are recessed within the holes 34 so that a flat surface 37 is presented to receive the force applying member 16.

One of the major difficulties in handling and transporting the integrated circuit chips, particularly with the delicate leads 54 extending therefrom, where such leads are plated metal wires of a small, typically rectangular cross section, on centerlines of 0.016 inches, is damage and bending of the leads. FIGS. 10 and 11 represent an approach by which the lower surfaces 76 of the ribs 70 are profiled to include plural, lateral peaks and valleys 78 to capture, align and secure the lead contact portions 56, see FIG. 11.

FIGS. 12 and 13 represent an alternative approach to the lead separation/alignment means of FIGS. 10 and 11. In the embodiment of FIGS. 12 and 13, the wall 80 of the slot 30 has been provided with plural grooves 80, where such grooves are defined by plural peaks and valleys on centerlines comparable to the lead centerlines. Though not illustrated, grooves or separators may be included in the base of the slot. Thus, by these arrangements, a lead 54 is caused to settle or seat within a respective groove 80 where it properly aligns with an appropriate circuit trace on the underlying elastomeric connector 32. By the systems of the respective embodiments in FIGS. 10 to 13, it will be seen that an effective means has been provided to separate, align and protect the delicate chip lead portions 54.

We claim:

1. A socket system for mounting to a first planar electronic device, where said system receives a second planar electronic device for electrical interconnection to said first planar electronic device, said system includes, a frame comprising a peripheral body portion, a central recess terminating in a floor for receiving said second planar electronic device, converging side walls extending from said body portion down to said floor, and plural through slots for receiving resilient electrical interconnection means to electrically connect said planar electronic devices, and a force applying member adapted to provide a normal force to said second planar electronic device and be mechanically secured to said frame, said force applying member including plural ribs arranged to overlie portions of said converging side walls, whereby as said force applying member is brought into engagement with said frame, said ribs, in contact with said converging side walls, are cammed inwardly into contact with said second planar electronic device to apply a normal force thereto in contact with said resilient electrical interconnection means.

2. The socket system according to claim 1, wherein said frame and said force applying member include cooperative latching members to mechanically secure the same together.

3. The socket system according to claim 1, wherein said second planar electronic device includes a plurality of leads extending therefrom, where said leads are L-shaped and are positioned to lie within said slots.

4. The socket system according to claim 2, wherein said leads comprise of a first leg adjacent to a wall of said slot, and a second leg perpendicular thereto in contact with said resilient electrical interconnection means, and that in the assembled and secured position said ribs apply a lateral force to said first legs and a normal force to said second legs.

5. The socket system according to claim 4, wherein said resilient electrical interconnection means comprises a thin flexible dielectric film, having etched electrical circuitry thereon, wrapped around an elastomeric core.

6. The socket system according to claim 4, wherein said second planar electronic device includes a body portion with leads extending from the periphery of said body portion, and the length of a given said rib is essentially co-extensive with a respective side of said body portion.

7. The socket system according to claim 4, wherein as said force applying member is brought into full engagement with said frame, said ribs effect wiping of the respective said first legs.

8. The socket system according to claim 1, wherein said frame and said first planar electronic device include cooperative means for aligning said frame to said first planar electronic device.

9. The socket system according to claim 6, wherein the body portion of said second planar device is spaced from said frame floor, and that said body portion is supported within the system by said leads in contact with said resilient electrical interconnection means.

10. The socket system according to claim 3, wherein said ribs are provided with plural, lateral peaks and valleys to capture, align and secure said leads within said system.

11. The socket system according to claim 3, wherein the wall of said slot underlying the lead is provided with plural grooves, and that each groove is intended to receive a single lead for aligning the same with a corresponding electrical trace on said elastomeric connector.

* * * * *